United States Patent [19]

Miyaji

[11] Patent Number: 5,070,482

[45] Date of Patent: Dec. 3, 1991

[54] STATIC RANDOM ACCESS MEMORY

[75] Inventor: Fumio Miyaji, Kanagawa, Japan

[73] Assignee: Sony Corporation, Tokyo, Japan

[21] Appl. No.: 505,157

[22] Filed: Apr. 5, 1990

[30] Foreign Application Priority Data

Apr. 6, 1989 [JP] Japan .................................. 1-87591
Apr. 7, 1989 [JP] Japan .................................. 1-88229

[51] Int. Cl.$^5$ .......................................... G11C 13/00
[52] U.S. Cl. .............................. 365/230.06; 365/154; 365/189.01
[58] Field of Search ...................... 365/189.01, 230.06, 365/154, 230.01, 190

[56] References Cited

U.S. PATENT DOCUMENTS 4,961,172 10/1990 Shubat et al. .................. 364/230.06

Primary Examiner—Terrell W. Fears
Attorney, Agent, or Firm—Hill, Van Santen, Steadman & Simpson

[57] ABSTRACT

A static RAM in which the threshold voltage of the drive transistors of a memory cell is higher than the threshold voltage of the access transistors, and in which the impedance of the access transistors is lower during writing then during reading, for improving data retention properties of the memory cell. The bit or data lines for reading data from the memory cell is provided with an equalizing circuit and data writing is performed from a writing buffer circuit. This writing buffer circuit is controlled by a pulse generator generating a pulse of a constant predetermined width on the basis of detected address transition to maintain a constant cycle time duration even on the occasion of a continuous write operation.

8 Claims, 8 Drawing Sheets

FIG. 3a　Address　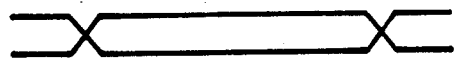
FIG. 3b　$\overline{WE}$
FIG. 3c　$\overline{EQ}$　
FIG. 3d　CE·WE
FIG. 3e　D,$\overline{D}$　
FIG. 3f　WL　
(PRIOR ART)
FIG. 4a　Address　
FIG. 4b　$\overline{WE}$
FIG. 4c　$\overline{EQ}$　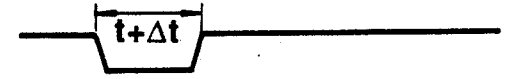
FIG. 4d　CE·WE
FIG. 4e　D,$\overline{D}$　
FIG. 4f　WL　
(PRIOR ART)

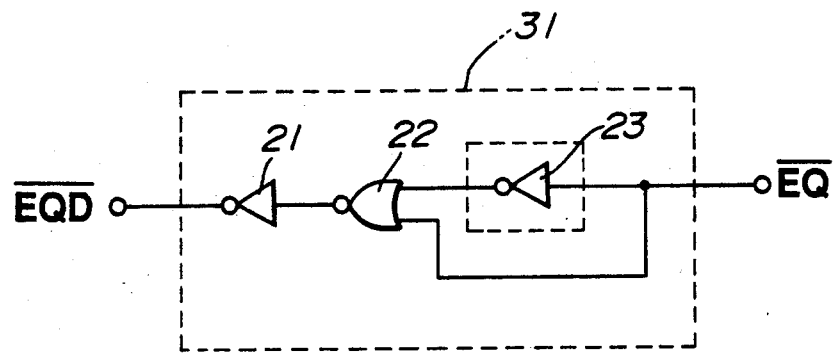
FIG. 10
| | | |
|---|---|---|
| FIG. 11a | Address | |
| FIG. 11b | $\overline{WE}$ | |
| FIG. 11c | $\overline{EQ}$ | |
| FIG. 11d | CE·WE | |
| FIG. 11e | D,$\overline{D}$ | |
| FIG. 11f | WL | |
| FIG. 11g | $\overline{EQD}$ | |
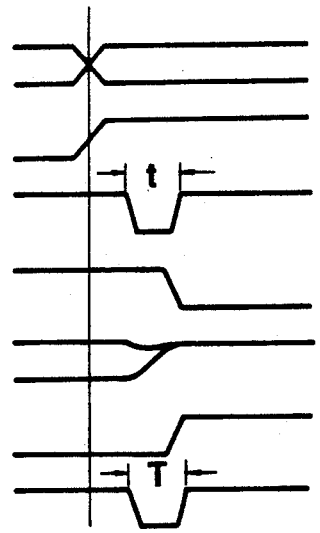

FIG. 12a Address
FIG. 12b $\overline{WE}$
FIG. 12c $\overline{EQ}$
FIG. 12d CE·WE
FIG. 12e D,$\overline{D}$
FIG. 12f WL
FIG. 12g $\overline{EQD}$
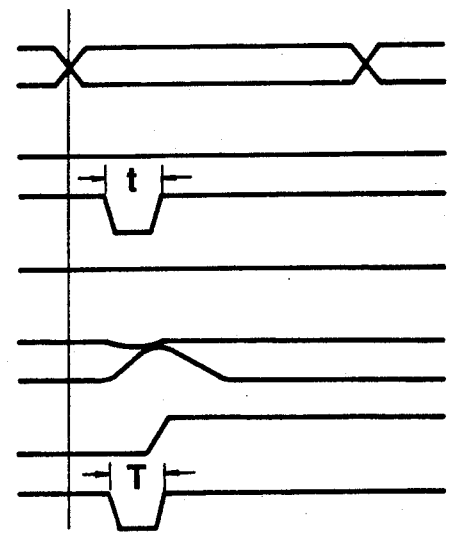
FIG. 13a Address
FIG. 13b $\overline{WE}$
FIG. 13c $\overline{EQ}$
FIG. 13d CE·WE
FIG. 13e D,$\overline{D}$
FIG. 13f WL
FIG. 13g $\overline{EQD}$
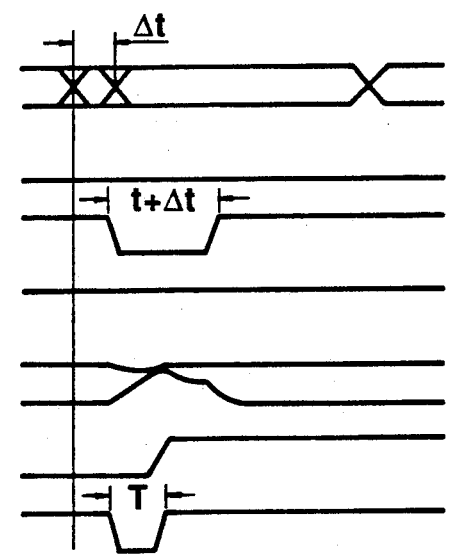

STATIC RANDOM ACCESS MEMORY

BACKGROUND OF THE INVENTION (1) Field of the Invention

This invention relates to a semiconductor memory and, more particularly, to a static RAM the memory cells of which are each constituted by a pair of drive transistors and a pair of access transistors.

(2) Description of the Prior Art

An SRAM or static RAM usually has a pair of drive transistors constituting a flipflop in each of its memory cells which is in turn provided with an access transistor having the word line as the gate electrode. Each access transistor is connected to one of paired bit lines and data are read out from or written into the memory cells by way of data line or bit line pairs.

FIG. 1 is a circuit diagram of a conventional SRAM circuit, wherein memory cells 51 arranged in a matrix configuration are sandwitched between bit line pairs 52, 53 and selection of each memory cell 51 is made by one of a plurality of word lines 54 arranged substantially orthogonally to the bit line pairs 52, 53. A plurality of bit line pairs 52, 53 collected together constitute data line pairs 55, 56. Column gates 57 for selection of the bit line pairs are provided between the data line pairs 55, 56 and the bit line pairs 52, 53. A pull-up circuit 58 and an equalizer circuit 59 are provided between these data line pairs 55, 56. The pull-up circuit 58 pulls up the potential across the data lines 55, 56, while the equalizer circuit 59 short-circuits and equalizes the paired data lines. The pull-up circuit 58 and the equalizer circuit 59 are driven by pulse signals from an address transition detection circuit, which will be explained subsequently.

A write buffer circuit 60 is connected across the paired data lines for driving one of the paired data lines to a low level and the other of the data lines to a high level. Write gates 61, 61 are also provided between the write buffer circuit 60 and the data line pairs 55, 56 for controlling the connection therebetween. These write gates 61, 61 are controlled by a write gate drive circuit 62 in such a manner that the write buffer circuit 60 and the data line pairs 55, 56 are connected to each other only when both a write control signal CE·WE and a write recovery assist signal $\overline{EQ}$ supplied to the write gate control circuit 62 are at the high level.

FIG. 2 shows a load resistor type memory cell 51 having a pair of drive transistors 71, 72 having their sources grounded and having their drains cross-coupled to the sources of the counterpart drive transistors. Access transistors 75, 76 are connected to the drains between the bit lines 52, 53. These access transistors 75, 76 have their gates connected to word line 54. Bit line loads 65, 66 are provided at terminal ends of the bit lines 52, 53 between these terminal ends and source voltage Vcc. The write and read operations are performed with the selected word line 54 being at a high level with the access transistors 75, 76 being turned on, while data storage is performed with one of nodes 63, 64 being at a high level and with the other mode being at a low level.

With the above described circuit construction of the SRAM, the data lines 55, 56 are driven during the write operation to the fully swung state, that is to the state in which one of the data lines is at a low level which is about equal to the ground voltage and the other data line is at a high level which is about equal to the source voltage Vcc. For this reason, during shifting from the write cycle to the readout cycle, the data lines 55, 56 and the bit lines 52, 53 are pulled up to the high level by the operation of the pull-up circuit 58 and the equalizer circuit 59, usually before selection of the word lines 54, for preventing possible data destruction in the memory cell.

If the write buffer circuit 60 is in operation when the pull-up circuit 58 and the equalizer circuit 59 are in operation, it becomes difficult to pull up the data lines and the bit lines to the high level. Hence, when the pull-up circuit 58 and the equalizer circuit 59 are in operation, the write gates 61, 61 are simultaneously turned off for electrically isolating the write buffer circuit 60.

FIGS. 3a-3f show the waveforms of various signals during the conntinuous write mode in which a write cycle is followed by another write cycle. It is assumed that the $\overline{WE}$ (write enable) signal (b) is at a low level so that the CE·WE (write control) signal (d), which is an internal signal, is at a high level. If address signal (a) is changed in this state, a pulse having a pulse width t is produced as $\overline{EQ}$ or write recovery assist signal (c) from an address transition detection circuit which generates a pulse based on address transition. This pulse is supplied to a write gate drive circuit 62 to turn off write gates 61, 61. On the data line pair 55, 56, having the level (e), the pull-up circuit 58 and the equalizer circuit 59 come into operation at this time, so that one of the data lines brought to the low level is boosted and equalized. After boosting to some extent and resulting decrease in the potential difference, the potential (f) on the selected word line for the cycle is raised for selecting the memory cell 51 by the word line.

However, first of all, since the standby currents are maintained in the above described SRAM at a lower value, the resistances of the load resistors 73, 74 of FIG. 2 are set to higher values. Consequently, it is necessary to maintain a high write potential, that is a potential at one of modes 63, 64, for data storage, and the current practice is to reduce the leakage current at the junction points or the sub-threshold current of the drive transistor for procuring an operational margin of a drive transistor. As a method for reducing the sub-threshold current, it is known to elevate the threshold voltage Vth of the drive transistors 71, 72. However, these drive transistors 71, 72 are produced by the same process as that of producing the access transistors 75, 76, so that, when the threshold voltage Vth of the drive transistors 71, 72 is elevated, the threshold voltage Vth of the access transistors is simultaneously elevated; so that the write potential given by the source voltage Vcc less the threshold voltage Vth of the access transistors is also lowered. Consequently, it is difficult to produce a high operational margin of the memory cell.

Secondly, with the above described SRAM, the write or readout cycle is started by the transition of a plurality of addresses $A_0$ to $A_x$. In the case of a continuous write mode, should the address transition occur at a plurality of addresses, the pulse width of the write recovery assist signal $\overline{EQ}$ from the address transition detection circuit is also increased in dependence upon the temporary shift of the number of the addresses.

FIGS. 4a-4f shows waveforms of various signal for the continuous write mode. It is now assumed that the write enable or $\overline{WE}$ signal (b) is at a low level, that the write control or CE·WE signal (d) is at a high level, and that transition has occurred at the address signal (a) a plurality of addresses with a time difference $\Delta t$. The pulse width of the write recovery assist or $\overline{EQ}$ signal (c), generated at this time by the address transition detection circuit, which generates a pulse each time the address transition occurs, is increased to (t+Δt). Consequently, the write inhibit time during which the write gates 61, 61 are turned off, is lengthened, while the time interval during which the potential on the data line (e) is raised and equalized by the operation of the pull-up circuit 58 and the equalizer circuit 59 is also lengthened, thus giving rise to an inconvenience that the time interval of the write cycle is lengthened.

Such protraction of the write cycle is caused not only by the timing deviation in the transition at a plurality of the addresses, but by manufacture tolerances or fluctuations in the manufacture process of the semiconductor memory devices.

SUMMARY OF THE INVENTION

It is an object of the present invention to provide a static RAM having excellent data retention properties with the memory cells of higher operational margin.

It is a further object of the present invention to provide a static RAM having a write cycle of constant time duration.

According to a broad aspect of the present invention, there is provided a static RAM comprising a plurality of memory cells arranged in a matrix configuration, each memory cell including a pair of drive transistors and a pair of access transistors selected by the word line. The threshold voltage of the drive transistors is set so as to be higher than the threshold voltage of the access transistors. By the word line potential, the access transistors are set to a lower impedance during writing than during reading. As an example of the word line driving method, the writing potential may be set so as to be equal to the source voltage Vcc, while the reading potential may be an intermediate level potential equal to the source voltage Vcc less the threshold voltage Vth.

According to a further aspect of the present invention, there is provided a static RAM comprising memory cells arranged in a matrix configuration, a data line pair provided on both sides of associated memory cells for writing or reading data, equalizing means provided across said data line pair for shorting said data line pair and precharging said data line pair if the occasion demands; and a writing buffer circuit for setting one of the paired data lines to a low level and the other data line to a high level as a function of the write data. The writing buffer circuit is controlled by a pulse generator detecting address transition to generate a pulse of a predetermined pulse width. The pulse generator controls the operation of the writing buffer circuit and generates pulses of a constant pulse width at all times responsive to pulses from an address transition detection circuit or the like. Thus pulse generator may be constitutes for example as a waveform transform circuit such as a differentiating circuit.

BRIEF DESCRIPTION OF THE DRAWINGS

FIGS. 3a–3f are waveform diagrams for illustrating the operation of the conventional SRAM.

FIGS. 4a–4f are waveform diagrams for illustrating the operation when the write cycle of the conventional SRAM is lengthened.

FIG. 10 is a circuit diagram showing a waveform transform circuit of the SRAM shown in FIG. 9.

FIGS. 11a–11g are waveform diagram for illustrating the operation of the SRAM shown in FIG. 9 during the write recovery time.

FIGS. 12a–12g are waveform diagram for illustrating an operation of the SRAM shown in FIG. 9 during the continuous write mode.

FIGS. 13a–13g are waveform diagrams for illustrating another operation of the SRAM shown in FIG. 9 during the continuous write mode.

DETAILED DESCRIPTION OF THE INVENTION

First Embodiment

Figure 5:
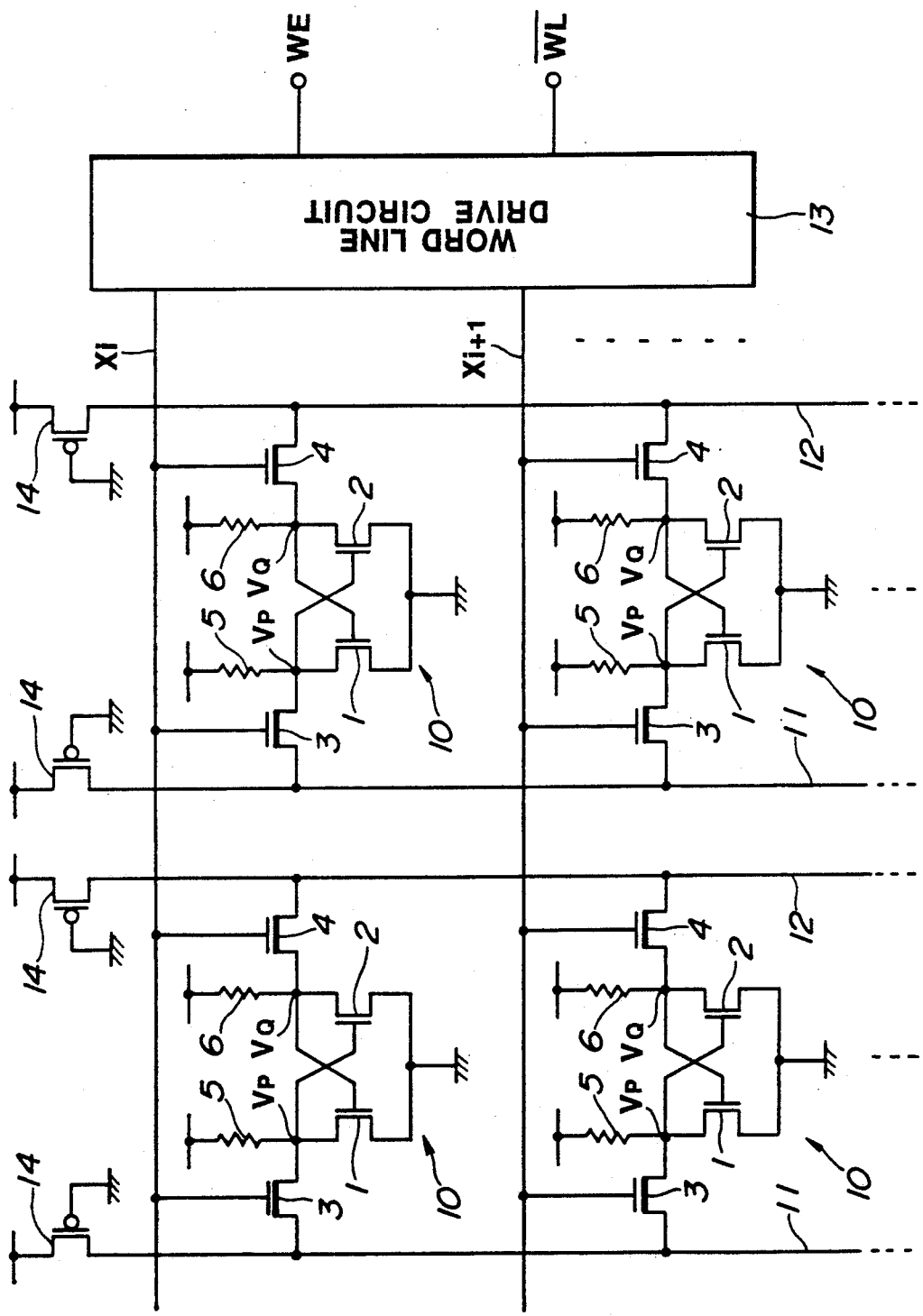
FIG. 5 is a circuit diagram showing essential of a circuit of an example of the SRAM according to the present invention.

FIG. 5 shows a circuit organization of an SRAM having memory cells of a matrix configuration of the present illustrative embodiment wherein the memory cells 10 are arranged in a matrix configuration with each memory cell 10 including a pair of nMOS transistors as drive transistors 1, 2. Each of these drive transistors 1, 2 has its source supplied with a ground voltage GND, while having its gate cross-coupled to the drain of the counterpart drive transistor. The drains of the drive transistors 1, 2 are connected to one ends of high resistance load resistors 5, 6, the other ends of which are supplied with the source voltage Vcc. These load resistors 5, 6 and the drive transistors 1, 2 make up a pair of inverters having their inputs and outputs cross-coupled to each other to constitute a flipflop. The threshold voltage Vth of the drive transistors 1, 2 is set to a value which will suppress the sub-threshold current to a practically neglictible value, and is set for example so as to be higher about 0.8 to 0.9 V than the usual value.

In each memory cell 10, the access transistors 3, 4 are connected between the drains of the drive transistors 1, 2 and the bit lines 11, 12 respectively. The access transistors 3, 4 have their gates connected to word lines $X_i$, $X_{i+1}$, ..., so that the turning on and off of the access transistors is controlled from the potential of the word lines $X_i$, $X_{i+1}$, .... Each of the word line $X_i$, $X_{i+1}$, ... selects a row of memory cells with the aid of word line drive circuit 13. Each of the access transistors 3, 4 is an nMOS transistor having its threshold voltage Vth set to a lower value inorder to produce a higher write potential. The threshold voltage Vth is thus set for example so as to be lower by 0.5 or 0.6 V than the usual value. This threshold value Vth may be adjusted by an additional ion implantation process.

The bit line pairs 11, 12, arranged substantially orthogonally to the word lines $X_i$ $X_{i+1}$, ..., are used to read or write data in the memory cells with the aid of the access transistors 3, 4. Bit line loads 14, each consisting of a pMOS transistor, are connected at the terminal portions of the bit lines 11, 12. The source voltage Vcc is supplied to the source side of each bit line load 14. Although not shown, column selection transistors for selecting the bit line pairs are connected to these bit lines 11, 12. Sense amplifiers and write circuits, for example, not shown, are connected to a common data line in turn connected to these column selection transistors.

With the SRAM of the present embodiment, having the above described circuit organization, since the access transistors 3, 4 are selected during readout by an intermediate potential $V_M$, the impedance becomes higher than when the access transistors are selected by the source voltage Vcc. This increases the operational margin of the memory cell, as explained subsequently.

Figure 1:
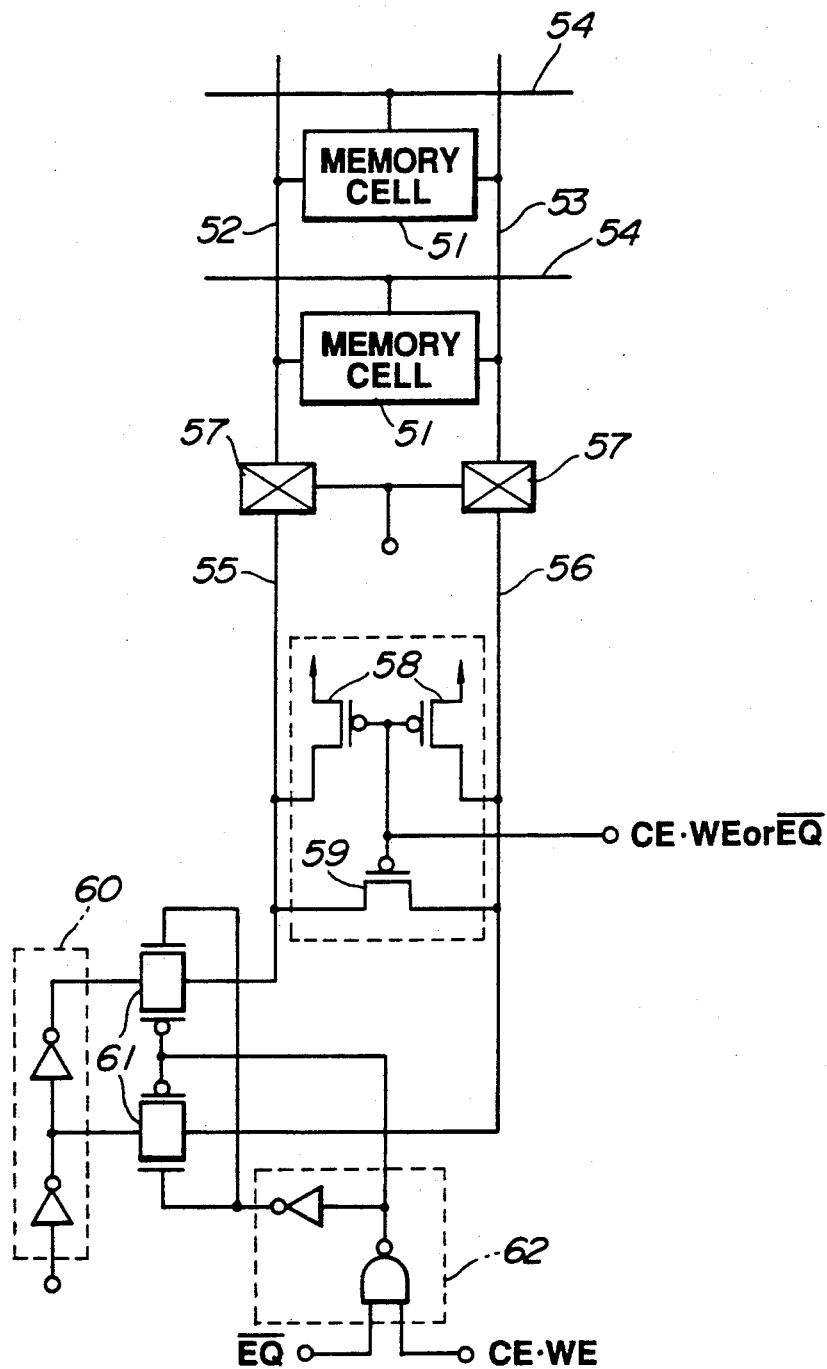
FIG. 1 is a circuit diagram showing essential portions of an example of a conventional SRAM.
Figure 2:
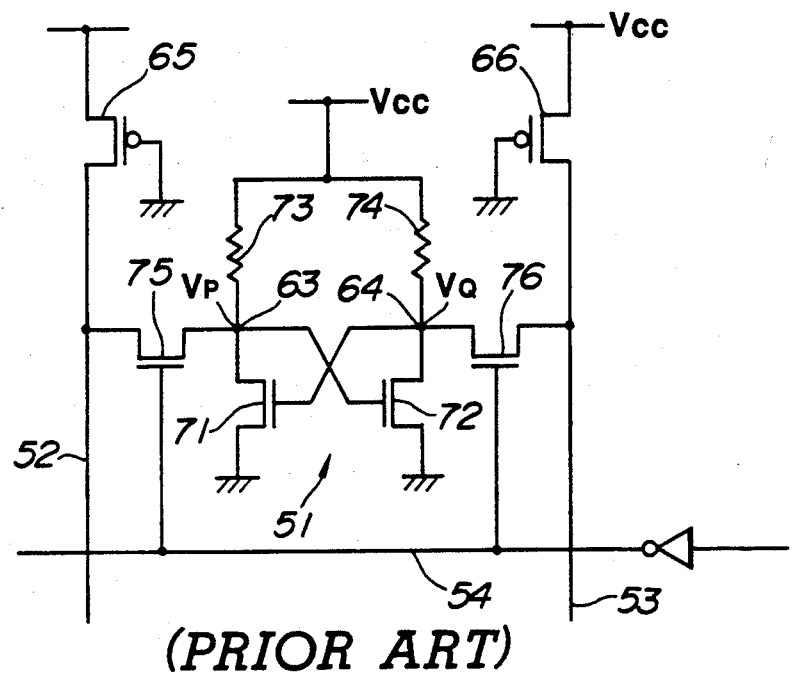
FIG. 2 is a circuit diagram of a high resistance load type memory cell of the conventional SRAM.
Figure 6:
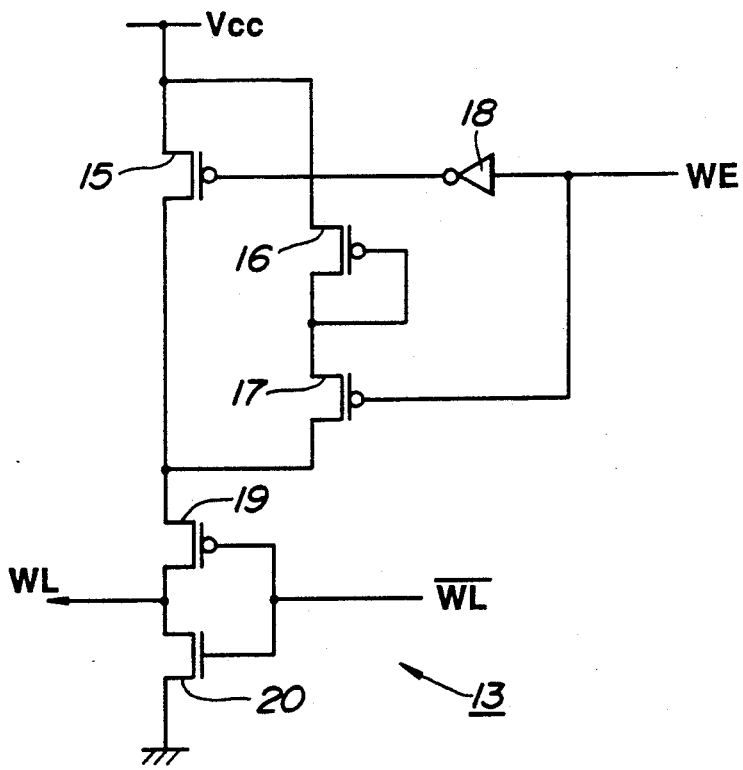
FIG. 6 is another circuit diagram of a word line drive circuit of the example of an SRAM according to the present invention.

FIG. 6 shows an example of the word line drive circuit for producing such intermediate potential $V_M$. Depending on the timing of the original word line selection signal $\overline{WL}$, the word line drive circuit generates signals having different signal levels for writing and reading. This word line drive circuit provides two alternate current paths that may be commuted in dependence upon write enable signal WE, and thus includes a channel through a pMOS transistor 15 and a channel through pMOS transistors 16, 17. The source voltage Vcc is supplied to the source of the pMOS transistor 15 of the one channel, while a signal inverted from the write enable signal WE is supplied from inverter 18 to the gate of the transistor 15. This pMOS transistor 15 has its drain connected to the source of a pMOS transistor 19 constituting an inverter. With the other channel, the pMOS transistor 16 connected to the source voltage Vcc acts as a diode, and a write enable signal or WE signal is supplied to the gate of the pMOS transistor 17 connected in series with the pMOS transistor 16. The pMOS transistor 17 has its drain connected to the source of a pMOS transistor 19 constituting an inverter.

The pMOS transistor 19 and the nMOS transistor 20 constitute an inverter. An original word line selection signal $\overline{WL}$ is supplied to the common gate path of the transistors 19, 20, while a word line select signal WL, having different potentials for writing and reading, is output at the common drain path of the transistors 19, 20.

Figure 7A:
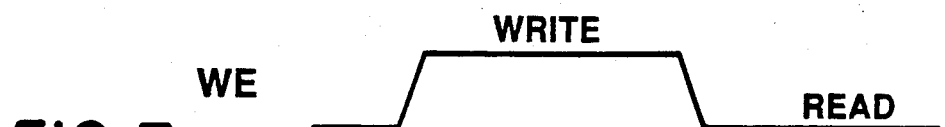
FIGS. 7a, 7b and 7c are waveform for illustrating the operation of the word line drive circuit.
Figure 7B:
Figure 7C:
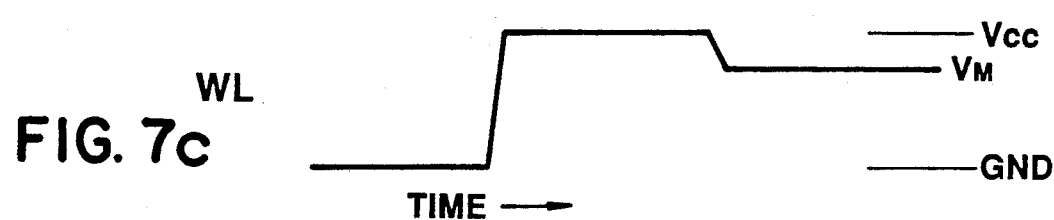

Reference is made to FIGS. 7a-7c which are waveform diagrams for illustrating the operation of the circuit shown in FIG. 6. During writing, write enable signal WE is set to a high level approximately equal to Vcc, so that pMOS transistor 17 is turned off, while the pMOS transistor 15, to which the signal is supplied via inverter 18, is turned on. This raises the source potential of the pMOS transistor 19 to the source potential Vcc, so that the word line selection signal WL is swung between the ground voltage GND and the source voltage Vcc, in dependence upon the original word line selection signal $\overline{WL}$.

On the other hand, during readout, write enable signal WE is set to a low level approximately equal to GND, so that the pMOS transistor 15 is turned off, while the pMOS transistor 17 is turned on. Thus the current path is changed from that for writing and the current flows to the source of the pMOS transistor 19 via transistors 16, 17. The pMOS transistor 16 has its drain connected to its gate and thus acts as a diode so that the potential is lowered at the source of the pMOS transistor 17 by a value equal to its threshold voltage Vth. Thus the source potential of the pMOS transistor 19 is at an intermediate potential $V_M$ equal to the source voltage Vcc less the threshold voltage Vth so that the word line selection signal WL is swung between the ground voltage GND and the intermediate potential $V_M$.

When the word lines $X_i$, $X_{i+1}$, ... are selected with the aid of the above described word line drive circuit, the word line selected for writing is at the potential equal to the source voltage Vcc, while the impedances of the access transistors 3, 4, having a lower setting value of the threshold voltage Vth, are low, so that the write potential, which is the gate-to-drain potential of the drive transistors 1, 2, is increased.

During reading, the selected word line is at the intermediate potential $V_M$, by the operation of the word line drive circuit 13. Thus the impedance of the access transistors 3, 4 becomes higher than during writing. As a result, the voltage drop by the access transistors 3, 4 during readout is increased to cause changes in the gate potential of the drive transistors 1, 2 under the influence of the voltage boosting on the bit lines to prevent possible data inversion or destruction. That is, the β R ratio and the operational margin are increased to improve the resistance against software errors.

With the above described SRAM of the present illustrative embodiment, the threshold voltage Vth of the access transistors 3, 4 is low, whereas the threshold voltage Vth of the drive transistors 1, 2 is high, so that it becomes possible to increase the write voltage. On the other hand, due to the high threshold voltage Vth of the drive transistors 1, 2, the sub-threshold current may be reduced to realize a low standby current.

Figure 8:
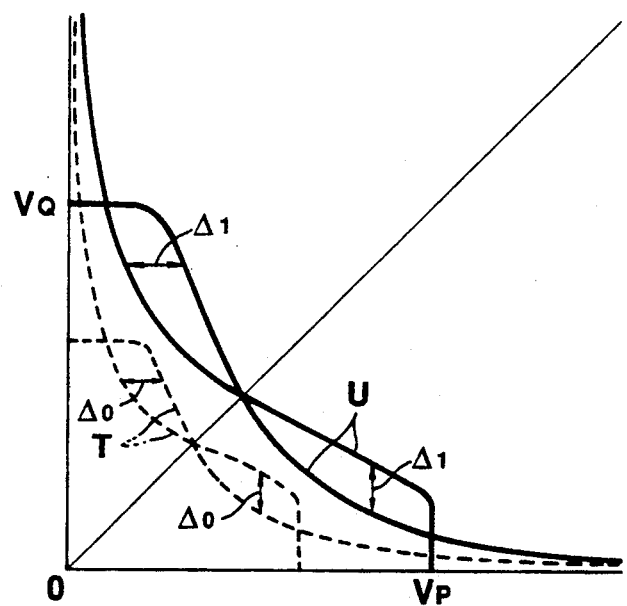
FIG. 8 is a chart showing the electrical potential at cross-coupled contacts of the semiconductor memory of the present invention and the conventional semiconductor memory for illustrating the difference in the operational margin in the respective memory cells.

Referring to FIG. 8, in which the operational margin of the memory cell of the conventional SRAM is compared to that of the memory cell of the present embodiment, broken lines T stand for potentials $V_P$ and $V_Q$ at the cross-coupled contact portions of the memory cell of the conventional SRAM as the comparative example and solid lines U stand for potentials $V_P$ and $V_Q$ at the cross-coupled contact portions of the memory cell of the SRAM of the present illustrative embodiment.

With the comparative example, as shown by the broken lines T, due to the high threshold voltage Vth of the access transistor, the write potential, that is the potentials $V_P$, $V_Q$ at the cross-coupled contact points, becomes generally low, with the operational margin of the memory cell shown at $\Delta 0$ being also diminished. With the present embodiment, as shown by solid lines U, since the threshold voltage Vth of the access transistors 3, 4 is set to a lower value, the write potential is raised, with the potentials $V_P$, $V_Q$ at the cross-coupled contact points exhibiting generally large amplitudes, with the operational margin of the memory cell shown at $\Delta 1$ also being increased.

During readout, the selected word line is set to the intermediate potential $V_M$, by the operation of the word line drive circuit 13. Consequently, the access transistors 3, 4 are at a higher impedance than during writing, with the β R ratio and the operational margin of the memory cell being increased.

Second Embodiment

Figure 9:
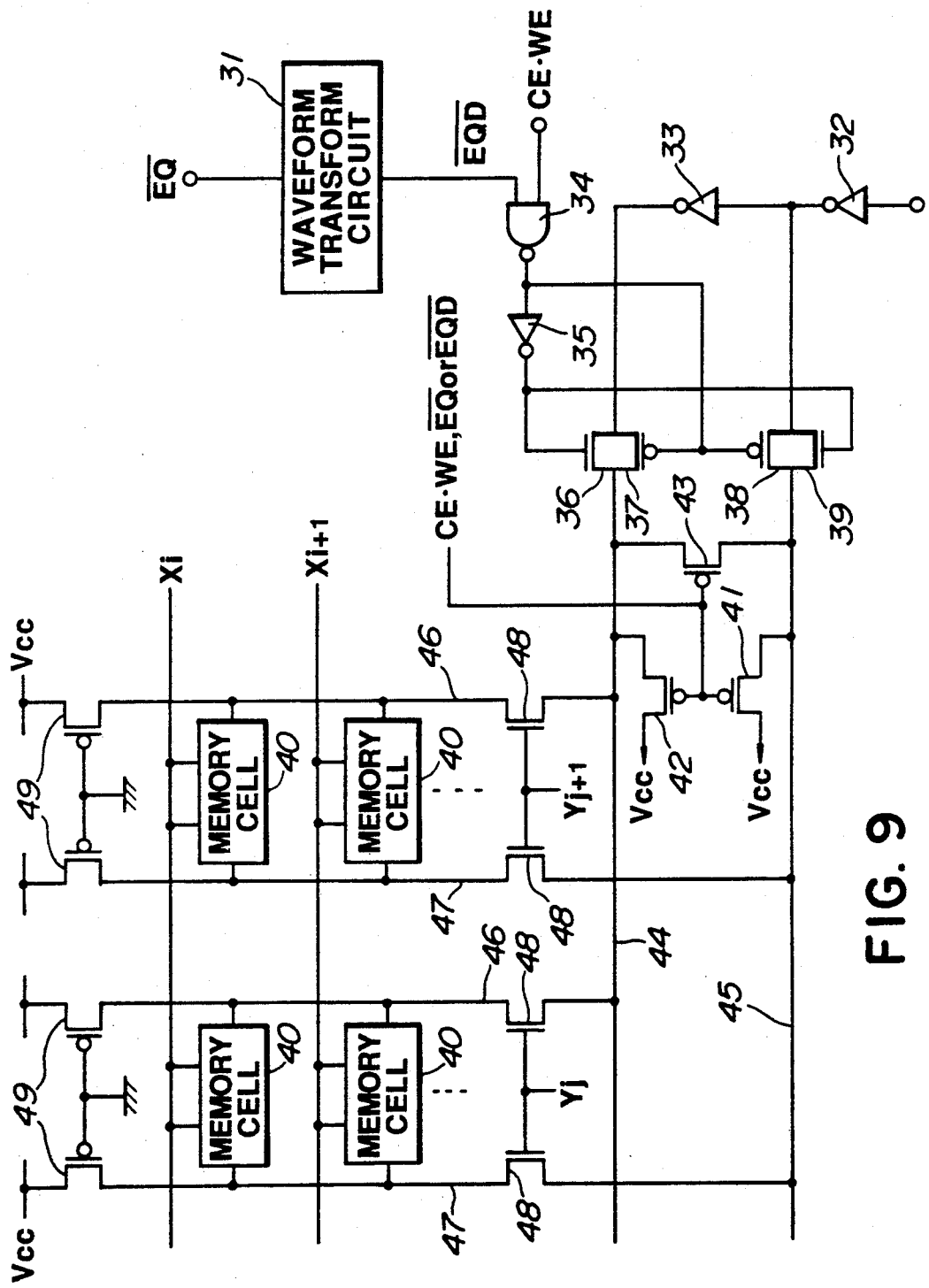
FIG. 9 is a circuit diagram showing essential parts of another example of the SRAM of the present invention.

FIG. 9 shows a circuit organization of an SRAM according to the second embodiment of the present invention.

A plurality of memory cells 40 are arranged in a matrix configuration. Each memory cell 40 includes a pair of drive transistors constituting a flipflop and a pair of loads, and a pair of access transistors for input and output controlling are provided at the input and output terminals of the flipflop. In each memory cell 40, the access transistors are connected to word lines $X_i$, $X_{i+1}$, ... for selecting an arbitrary row of the memory cells 40. The word lines $X_i$, $X_{i+1}$, ... are driven by, for example, a row decoder and a word driver, on the basis of address signals.

On both sides of these memory cells 40, a pair of bit lines 46, 47 are provided for each column of the memory cells 40. These bit lines 46, 47 function as part of the data lines so that data may be transferred between the bit lines and the associated memory cell 40 on the basis of the bit line potential. The arraying direction of the bit lines 46, 47 is substantially orthogonal to the arraying direction of the word lines $X_i$, $X_{i+1}$, .... Bit line loads 49, 49 are provided at the terminal portions of these bit lines 46, 47. Each of these bit lines 49, 49 is constituted by a pMOS transistor to the gate and the source of which the ground voltage GND and the source voltage Vcc are supplied, respectively. The bit line pair 46, 47 is provided with column selection transistors 48, 48. These column selection transistors 48, 48 are controlled by column selection signal lines $Y_j$, $Y_{j+1}$, to which signals are supplied from a column decoder, not shown.

These paired bit lines 46, 47 are connected to data lines 44, 45 by way of the column selection transistors 48, 48. The data line pair 44, 45 connect together a plurality of the bit line pairs 46, 47. An equalizing pMOS transistor 43 as equalizing means is connected between the data lines 44, 45. This pMOS transistor 43 has its source and drain connected to a data line 44 and a data line 45, respectively, and a write recovery assist signal $\overline{EQ}$ or a signal $\overline{EQD}$ generated by a waveform transform circuit 31, for example, is supplied to the gate of the pMOS transistor 43. When the gate voltage of the pMOS transistor 43 is at the low level, that is, when it is necessary to eliminate the state in which the voltage across the data lines 44, 45 is fully swing between the high and the low levels, the data lines 44, 45 are equalized by means of the pMOS transistor 43. pMOS transistors 42, 41 constituting a pull-up circuit are also connected to the data line pair 44, 45. Each of these pMOS transistors 42, 41 has its source supplied with the source voltage Vcc, while having its gate supplied with the same signal as that supplied to the gate of the pMOS transistor 43. By the operation of these pMOS transistors 41, 42, the data line potential is raised towards the source voltage Vcc during equalization. Although not shown, sense amplifiers and output buffers, for example, are connected to the data line pair 44, 45.

A write buffer circuit consisting of inverters 32, 33 is connected to the data line pair 44, 45. Between the buffer circuit and the data line pair 44, 45, there are connected MOS transistors 36 to 39 functioning as the write gates for controlling the connection and interruption between the buffer circuit and the data line pair 44, 45. The inverter 32 of the buffer circuit, to which write data are input, has ints output terminal connected to one source-drain path of a CMOS switch consisting of a pMOS transistor 38 and an nMOS transistor 39. The other source-drain path of the CMOS switch is connected to data line 45. The input terminal of the inverter 33 is connected to the output terminal of the inverter 32, while the output terminal of the inverter 33 is connected to one source-drain path of a CMOS switch consisting of a pMOS transistor 37 and an nMOS transistor 36.

The other source-drain path is connected to data line 44. Since the inverters 32, 33 are connected in series with each other and the outputs of the inverters 33, 32 are supplied to the data lines 44, 45, respectively, one of the data lines 44 or 45 is at a high level during writing, with the other data line being at a low level.

The gates of the pMOS transistor 37, 38 and the nMOS transistors 36, 39, functioning as the write gates, are controlled by write control signal CE·WE and signal $\overline{EQD}$ supplied from the waveform transform circuit 31 as pulse generating means. The waveform transform circuit 31 is a circuit which generates a pulse of a predetermined pulse width. Thus the write recovery assist signal $\overline{EQ}$ is input to the circuit 31 as a trigger input, and a signal $\overline{EQD}$ having a predetermined pulse width is output from the circuit 31. This signal $\overline{EQD}$ is supplied to a NAND circuit 34 simultaneously with the write control signal CE·WE. The output of this NAND circuit 34 is supplied to the gates of the pMOS transistors 37, 38, while being simultaneously supplied to the input terminal of the inverter 35. The output of the inverter 35 is supplied to the gates of the nMOS transistors 36, 39. In the writing inhibit state in which the write gates are turned off, the output of the NAND circuit 34 is at a high level if the signal $\overline{EQD}$ is at a low level, even though the write control signal CE·WE is at a high level, so that the MOS transistors 36 to 39 are all turned off. Hence, if the time interval, that is the pulse width, during which the signal $\overline{EQD}$ is at a low level, is rendered constant, it becomes possible to maintain a constant write inhibit cycle to prevent the write cycle from being lengthened.

Reference is now had to FIG. 10 showing an example of the waveform transform circuit 31. This waveform transform circuit, which is a differentiating circuit generating a pulse of a predetermined pulse width, is made up of an inverter 23 governing the delay time, a two-input NOR circuit 22 and an inverter 21 as an output stage. The write recovery assist signal $\overline{EQ}$ from the address transition detection circuit is supplied to an input terminal of the inverter 23 and to one of the input terminals of the two-input NOR circuit 22. The inverter 23 functions as a delaying device for inverting the write recovery assist signal $\overline{EQ}$ input after a predetermined time and supplying the inverted output to the other input terminals of the NOR circuit 22. In the NOR circuit 22, the output is at a high level only when both inputs are at the low level. That is, the output of the NOR circuit 22 is at a high level only when the write recovery assist signal $\overline{EQ}$ is at the low level and the inverted data are as yet not output from inverter 23, with the time interval during which the output of the NOR circuit 22 is at a high level being and corresponding to the delay time of the inverter 23. The output of the NOR circuit 22 is supplied to the output stage inverter 21 which outputs the signal $\overline{EQD}$ having a constant pulse width. Hence, even if the write control signal WE·CE is at the high level, the MOS transistors 36 to 39 constituting the writing gates are turned off during a predetermined time period, as mentioned previously, for establishing the writing inhibit state continuing for a predetermined time.

Reference is now had to FIGS. 11 to 13 for illustrating the various operating states of the RAM of the present embodiment.

During write recovery, as shown in FIGS. 11, the write enable or $\overline{WE}$ signal (b) shifts from the low level to the high level with the transition of the address signal (a). Accordingly, the operating mode shifts from the writing mode to the reading mode. By the operation of the address transition circuit, a pulse having a pulse width t appears in the write recovery assist or $\overline{EQ}$ signal (c) by the transition of the address signal (a). Also with the change in the $\overline{WE}$ signal (b), the CE·WE signal (d) shifts from the high level to the low level after a certain delay. The waveform transform circuit 31, to which the signal $\overline{EQ}$ (c) having the above mentioned pulse width t is supplied, generates a pulse of a predetermined width T in the $\overline{EQD}$ signal (g) by the pulse of the $\overline{EQ}$ signal, as will be explained subsequently. The $\overline{EQD}$ signal (g), in which the pulse has been generated by the waveform transform circuit 31, and the CE·WE signal (d), are supplied to the NAND circuit 34 which control the MOS transistors 36 to 39 acting as the write gates. Consequently, after the CE·WE signal (d) is shifted to the low level, or when the pulse of the $\overline{EQD}$ signal (g) is at the low level, the MOS transistors 36 to 39 are all turned off for establishing the write inhibit state. In this write inhibit data, the inverters 32, 33 constituting the writing buffer circuit are segregated from the data lines 44, 45. The pMOS transistors 41 to 43, controlled by such signals as $\overline{EQ}$ signal (c) or $\overline{EQD}$ signal (g) are turned on with pitch transition of the signals such as $\overline{EQ}$ signal. In this manner, the data lines 44, 45, including the bit lines 46, 47 are subjected to the equalizing and pull-up operations so that the potential (e) on the data lines is raised and equalized. The potential (f) on the selected one of the word lines $X_i$, $X_{i+1}$, ... shifts from the low level to the high level to select a row of the memory cells 40. By virtue of such write recovery operation, the reading operation can be started with only small potential difference across the data lines 44, 45.

Reference is now had to the case wherein, during the continuous write mode of the SRAM of the present illustrative embodiment, the address signal is subject to only small fluctuations in timing and the $\overline{EQ}$ pulse signal is of a shorter pulse width.

During the continuous write mode, the $\overline{WE}$ signal (b) continues to be at a low level, whereas the CE·WE signal (d) continues to be maintained at a high level. Should the transition of the address signal (a) occur within a shorter period of time, a pulse having a pulse width t is generated in the $\overline{EQ}$ signal (c) by such transition of the address signal (a). The waveform transform circuit 31, which is already supplied with the $\overline{EQ}$ signal (c), generates an $\overline{EQD}$ signal (g) having a predetermined pulse width T from the $\overline{EQ}$ signal (c) as will be explained subsequently. The pulse of this $\overline{EQD}$ signal (g) raises the output of the NAND circuit 34 to a high level, depending on the predetermined pulse width or duration T. As a result, the pMOS transistors 39, 38 constituting the write gates are turned on, whereas the nMOS transistors 36, 39, the gate voltage of which is set to the low level by the inverter 35, are turned off. Thus inverters 32, 33 as the write buffer circuit are electrically segregated from the data line 44, 45 during the period of the pulse width T to effect writing inhibition.

Simultaneously with the control of the writing gates, the pMOS transistors 41 to 43, functioning as the equalizing and pull up circuits, come into operation responsive to the $\overline{EQ}$ signal (c) to effect boosting and equalization of the data line pair 44, 45. This raises and equalizes the potential across the data lines. The potential (f) on the word line, which has been selected for writing, is increased to effect data writing in the memory cell 40.

Reference is now had to FIGS. 13 for illustrating the case in the continuous write mode in which the address signal is subject to considerable fluctuations in timing and the $\overline{EQ}$ signal is of a longer pulse width.

During the continuous write mode, the $\overline{WE}$ signal (b) continues to be at a low level, and the CE·WE signal (d) continue to be maintained at a high level, similarly to the corresponding signals shown in FIG. 12. When the transition of the address signals (a) sequentially occur at a plurality of addresses, each with a time difference $\Delta t$, the address transition detection circuit generates a pulse each time the address transition occurs, so that the pulse width of the pulse of the $\overline{EQ}$ signal from the address transition detection circuit is equal to $(t+\Delta t)$.

The pulse of the pulse width $(t+\Delta t)$ is supplied to the waveform transform circuit 31. In the operation of the waveform transform circuit 31, as shown in FIG. 10, the output of the NOR circuit 22 goes high only when the two inputs of the NOR circuit 22 are at the low level, and goes low otherwise. Therefore, the output of the NOR circuit 22 goes high during the delay time since the pulse of the $\overline{EQ}$ signal (c) is supplied to the inverter 23 until the inverted signal is output. Since the delay time substantially corresponds to the constant pulse width T, the output pulse of the $\overline{EQD}$ signal (g) from inverter 21 has a substantially constant time duration T.

The pulse of the $\overline{EQD}$ signal (g) having a constant pulse width even when the pulse of the $\overline{EQ}$ signal (c) has a longer pulse width raises the output of the NAND circuit 34 to a high level during the time corresponding to the constant pulse width T. As a result, the pMOS transistor 37, 38 constituting the write gates are turned off, whereas the nMOS transistors 36, 39, the gate voltage of which is set to a low level by the inverter 35, are turned off. Thus the inverters 32, 33 functioning as the writing buffer circuit, are electrically segregated from the data lines 44, 45 during the period corresponding to the constant pulse width T, despite the longer pulse width $(t+\Delta t)$ of the $\overline{EQ}$ signal (c), so that a writing inhibit state is established during the predetermined time period T.

Since the pulse of the $\overline{EQD}$ signal (g) controlling the write gate by the waveform inhibit circuit 31 has the pulse width or duration T, there is no risk of protraction of the writing inhibit state. Therefore, after the potential (e) across the data line pair 44, 45 is raised and equalized by the operation of the pMOS transistors 41 to 43, the potential (f) on the word line (f) is raised to effect the selecting operation to effect immediately the writing operation in the selected memory cell 40. This assures a constant duration of the write cycle.

With the above described SRAM of the present illustrative embodiment, the pulse of a constant pulse width controlling the write gate is output by the waveform transform circuit 31. In this manner, the write cycle during the continuous write mode may be prevented from being prolonged.

The waveform transform circuit 31 may be of any other circuit construction when that shown in FIG. 10 if only the circuit is capable of outputting a pulse having a constant predetermined pulse width.

What is claimed is:

1. A semiconductor memory device adapted for data writing and reading, comprising a plurality of memory cells arranged in a matrix configuration, each memory cell including a pair of access transistors for row selection and a pair of drive transistors cross-coupled to each other to constitute a flipflop circuit, each said access transistor having a threshold voltage lower than the threshold voltage of said drive transistor, a plurality of word lines connected to the gates of said access transistors of the memory cells for row selection, a plurality of bit lines connected to said drive transistors of said memory cells by means of said access transistors to effect data writing or reading, and word line drive means for driving said word lines so that said access transistors are at a lower impedance during writing than during reading.

2. The semiconductor memory device according to claim 1 wherein the access transistors and the drive transistors of said memory cells are nMOS transistors, a resistor load is connected between a junction of said access transistor and said drive transistor and a source voltage line, and wherein said word line drive means raises the potential of the selected word line to the source voltage during writing and to an intermediate voltage lower than the source voltage and higher than the ground voltage during reading.

3. The semiconductor memory device according to claim 2 wherein said intermediate voltage is lower then the source voltage by the threshold voltage of a MOS transistor.

4. A semiconductor memory device for data writing and reading, comprising a plurality of memory cells arranged in a matrix configuration for effecting data storage, a bit line pair which is arranged on both sides of associated memory cells and across which a complementary potential difference apparatus at least during writing, equalizing means provided across the bit line pair for eliminating the complementary potential difference thereacross during writing, said equalizing means coming into operation before the next write or read cycle, a write buffer for producing the complementary potential difference across said bit line pair during writing responsive to input data, and pulse generating means for detecting address transition to generate a pulse of a constant predetermined pulse width to drive said writing buffer by said pulse.

5. A semiconductor memory device for data writing and reading, comprising a plurality of memory cells arranged in a matrix configuration and responsive to address signals to write or read data into or from each memory cell, a bit line pair which is provided on both sides of associated memory cells and across which a complementary potential difference appears at least during writing, a data line pair connected to a plurality of the bit line pairs by means of a column selection switch, equalizing means provided across the bit line pair and/or the data line pair for eliminating the complementary potential difference across said bit line pair and said data line pair during writing, said equalizing means coming into operation before the next write or read cycle, a write buffer responsive to input data to produce a complementary potential difference across said bit line pair and said data line pair during writing, and pulse generating means for detecting the transition of said address signals to generate a pulse of a constant predetermined pulse width to drive said writing buffer by said pulse.

6. The semiconductor memory device according to claims 4 or 5 wherein said pulse generating means comprises a differentiating circuit for differentiating an address signal transition detection signal.

7. The semiconductor memory device according to claims 4 or 5 wherein said equalizing means precharges said bit or data lines to a predetermined potential.

8. The semiconductor memory device according to claims 4 or 5 wherein said write buffer is connected to said bit or data lines by switching means and adapted to be set to the writing inhibit state by said switching means being turned off.

* * * * *